US009188606B2

(12) United States Patent
Johnson et al.

(10) Patent No.: US 9,188,606 B2
(45) Date of Patent: Nov. 17, 2015

(54) OSCILLOSCOPE CURRENT PROBE WITH INTERCHANGEABLE RANGE AND SENSITIVITY SETTING MODULES

(71) Applicant: Keysight Technologies, Inc., Minneapolis, MN (US)

(72) Inventors: Kenneth W. Johnson, Colorado Springs, CO (US); Edward Vernon Brush, IV, Colorado Springs, CO (US)

(73) Assignee: Keysight Technologies, Inc., Santa Rosa, CA (US)

( * ) Notice: Subject to any disclaimer, the term of this patent is extended or adjusted under 35 U.S.C. 154(b) by 383 days.

(21) Appl. No.: 13/872,606

(22) Filed: Apr. 29, 2013

(65) Prior Publication Data
US 2014/0320153 A1    Oct. 30, 2014

(51) Int. Cl.
*G01R 27/08* (2006.01)
*G01R 1/067* (2006.01)

(52) U.S. Cl.
CPC ........ *G01R 1/06788* (2013.01); *G01R 1/06766* (2013.01)

(58) Field of Classification Search
CPC ........... G01R 1/07342; G01R 1/06711; G01R 1/3627; G01R 1/3682; G01R 1/067; G01R 1/07314; G01R 1/023; G01R 1/2889; G01R 1/06716; G01R 1/2886; G01R 1/2831; G01R 1/16788; G01R 11/04; G01R 19/155; G01R 27/02; G01R 19/0092; G01R 27/16
USPC .......... 324/755.01, 437, 724, 754.01, 754.03, 324/149, 713
See application file for complete search history.

(56) References Cited

U.S. PATENT DOCUMENTS

| 4,139,817 | A | 2/1979 | Boer et al. |
| 4,672,306 | A | 6/1987 | Thong |
| 5,136,237 | A | 8/1992 | Smith et al. |
| 5,691,635 | A | 11/1997 | Pot et al. |
| 6,400,167 | B1 | 6/2002 | Gessford et al. |
| 6,407,562 | B1 | 6/2002 | Whiteman |
| 6,466,000 | B1 | 10/2002 | Nightingale |
| 6,603,297 | B1 | 8/2003 | Gessford et al. |
| 6,605,934 | B1 | 8/2003 | Campbell et al. |
| 6,704,670 | B2 | 3/2004 | McTigue |
| 6,856,126 | B2 * | 2/2005 | McTigue et al. ............. 324/72.5 |
| 6,956,362 | B1 | 10/2005 | Campbell et al. |
| 7,056,134 | B2 | 6/2006 | Martin et al. |
| 7,294,995 | B1 * | 11/2007 | Stevens et al. ............... 324/72.5 |
| 7,308,519 | B2 | 12/2007 | Dandy et al. |
| 7,312,603 | B2 | 12/2007 | Luo et al. |
| 7,592,822 | B2 | 9/2009 | Reed et al. |
| 2011/0074392 | A1 * | 3/2011 | Bartlett et al. ............. 324/76.44 |
| 2012/0146669 | A1 * | 6/2012 | Erickson ....................... 324/683 |

* cited by examiner

Primary Examiner — Tung X Nguyen
Assistant Examiner — Thang Le

(57) ABSTRACT

An oscilloscope current probe system includes a probe amplifier unit, a probe head identifier, and first and second probe heads interchangeably connectable to the probe amplifier unit. Each probe head has a respective electrically-readable type identifier, a respective current input to receive a current to be measured, a respective internal sensing resistor in connected series with the current input, and a respective output at which a measurement voltage across the sensing resistor is output. The first and second probe heads differ in the resistance of their sensing resistors and the way their type identifiers read. The probe amplifier unit includes a differential amplifier to amplify the measurement voltage output by the probe head connected thereto. The probe head identifier is to read the type identifier of the probe head connected to the probe amplifier unit.

31 Claims, 7 Drawing Sheets

OSCILLOSCOPE CURRENT PROBE WITH INTERCHANGEABLE RANGE AND SENSITIVITY SETTING MODULES

BACKGROUND

Substantially all oscilloscope current probes use Hall Effect sensors, transformers or a combination of the two to sense the magnetic field surrounding a conductor as current flows through the conductor. Such current probes output a voltage that is proportional to the sensed magnetic field while the magnetic field is proportional to the current passing through the conductor. Thus these transducers output a defined voltage per amp of current sensed.

Hall Effect sensors are used to sense DC and very tow frequency AC (<=100 kHz). Transformer-based sensors are used to sense AC only at frequencies as high as 2 GHz. Both types of probe include a ferrite core that encircles the conductor and through which the magnetic flux surrounding the conduct of passes. Since the conductor must pass through the ferrite core, there must be a loop of wire available that can be fed through the core. This style of probe has been in use for decades and has functioned well.

The explosive growth of handheld, battery powered electronic devices has generated a need for low-level current measurements so as to be able to adjust or optimize product design to improve battery life. The existing Hall Effect-or transformer-based oscilloscope probe technology is not well suited for the task of measuring milliamp and sub-milliamp current in battery powered devices.

Hall Effect elements are self-heating while measuring which results in unfavorable zero offset voltage shift as they warm up. This offset voltage shift directly effects measurement accuracy and repeatability, both of which are important when measuring small current. Transformer-only current probes cannot measure DC which is important in battery drain analysis.

The loop of wire that is necessary for the use of conventional current probes is an additional source of error. The user of these probes must install the loop of wire by breaking the circuit (such as by cutting a trace) and inserting a length of wire. Variations in the shape of the loop of wire after installation can result in measurement variations that are small but are nevertheless significant when the current being measured is small. Moreover, the loop of wire and the ferrite core it passes through create an inductor that presents a frequency-dependent impedance in series in the circuit under test that is another source of measurement error.

Finally, conventional current probes have been optimized for measuring currents of the order of 10s to 100s of amps and as such the voltage output from these probes is very small when measuring milliamps. In some cases, the voltage output is so small that it can be lost in the noise of the probe circuit of oscilloscope.

Accordingly, what is needed is a convenient ability to measure and to monitor the waveforms of currents typical of handheld portable devices over a frequency range ranging from DC to several gigahertz.

DETAILED DESCRIPTION

Figure 1A:
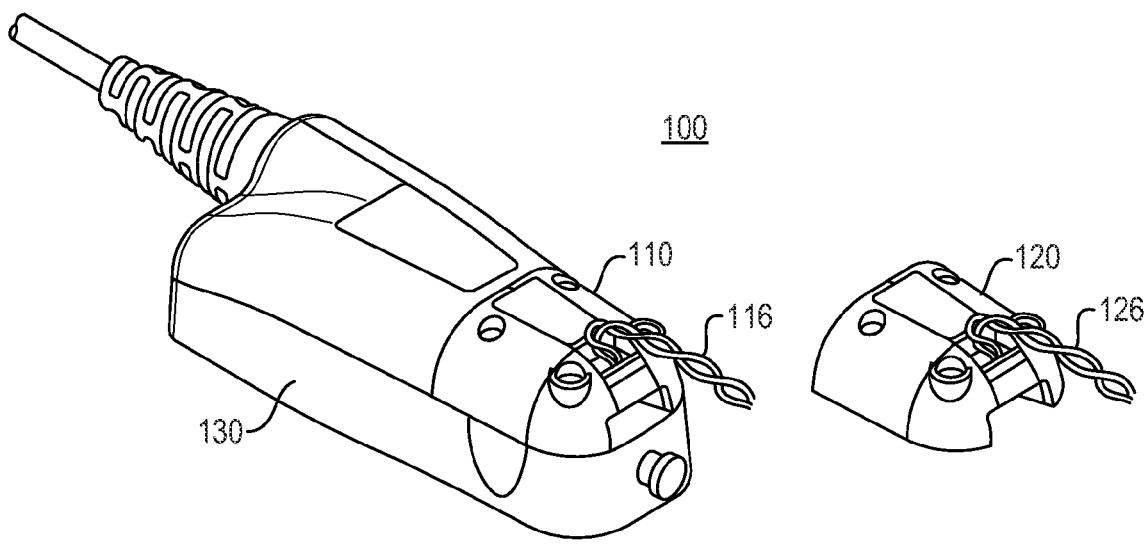
FIG. 1A is a perspective view showing an example of an oscilloscope current probe system in accordance with an embodiment.

An oscilloscope current probe system as disclosed herein uses a sense resistor as a current-to-voltage transducer in accordance with Ohm's Law. In an embodiment, the oscilloscope current probe system includes a first probe head, a second probe head, a probe amplifier unit, and a probe head identifier. The first probe head and the second probe head are interchangeably connectable to the probe amplifier unit. Each of the first probe head and the second probe head has a respective electrically-readable type identifier, a respective current input to receive a current to be measured, a respective internal sensing resistor in connected series with the current input, and a respective output at which a measurement voltage across the sensing resistor is output. The first probe head has a sensing resistor resistance different from, and a type identifier that reads different from, the sensing resistor resistance and the type identifier, respectively, of the second probe head. The probe amplifier unit includes a differential amplifier to amplify the measurement voltage output by the one of the probe heads. The probe head identifier is to read the type identifier of the one of the probe heads connected to the probe amplifier unit.

Locating the current sensing resistor inside a probe head that is detachable from the probe amplifier unit allows the user to select the probe head, from those supplied, whose sensing resistor has a value that is the best fit to the measurement task at hand and to optimize the burden voltage (voltage drop across the sensing resistor) for the circuit under test. This approach allows a probe head with a larger value of sensing resistor to be used for measuring smaller currents and a probe head with a larger value of sensing resistor to be used for measuring larger currents. Additionally, the current probe can easily be moved between multiple measurement points in the circuit without disturbing the circuit. The sensing resistor is electrically connected to the circuit under test by a measurement lead composed of a twisted pair of wires. The measurement lead is electrically connected to a current input of the probe head. The measurement lead has resistance of its own, but this resistance remains unchanged as the measurement lead is moved between locations in the circuit under test. This eliminates the variations in loop area that conventional current probes are susceptible to.

Some versions of the oscilloscope current probe system additionally include a third probe head to sense a current to be measured flowing through an external sensing resistor, external to the third probe head. The third probe head is connectable to the probe amplifier unit interchangeably with the first probe head and the second probe head. The third probe head includes a differential input to receive a measurement voltage generated across the external sensing resistor by the current to be measured, an output at which the measurement voltage is output, and an electrically-readable type identifier that reads differently from the type identifiers of the first probe head and the second probe head.

In some versions of the oscilloscope current probe system, the first probe head is a first type of probe head, the system additionally includes an additional probe head of the first type, and the probe heads of the first type have nominally identically-reading electrically-readable type identifiers and nominally-identical current sensing resistor resistances.

In some versions of the oscilloscope current probe system, the first probe head is a first type of probe head, the system additionally includes an additional probe head of the first type, and the probe heads of the first type have electrically-readable type identifiers that read more similarly and current sensing resistor resistances that are more similar to one another than to the electrically-readable type identifier and current sensor resistor resistance of the second probe head.

In another embodiment, the oscilloscope current probe system includes a first probe head to sense current through a user-defined sensing resistor, a second probe head, a probe amplifier unit and a probe head identifier. The probe heads are interchangeably connectable to the probe amplifier unit. Each of the first probe head and the second probe head has a respective electrically-readable type identifier. The type identifier of first probe head reads differently from the type identifier of the second probe head. The first probe head additionally has a differential input to receive a measurement voltage generated across the user-defined sensing resistor by the current being measured, and an output at which the measurement voltage is output. The second probe head additionally has a current input to receive a current to be measured, an internal sensing resistor connected in series with the current input, and an output at which a measurement voltage across the sensing resistor is output. The probe amplifier unit includes a differential amplifier to amplify the measurement voltage output by the one of the probe heads. The probe head identifier is to read the type identifier of the one of the probe heads connected to the probe amplifier unit.

A user-defined sensing resistor allows the user of the oscilloscope current probe system to select his or her own sensing resistor value. An ability to select the value of the sensing resistor enables the user to tailor the current-to-voltage transfer function of the oscilloscope current probe system to the magnitude of the current the user is trying to measure. An ability to select the value of the sensing resistor also allows the user to make his or her own compromise between signal-to-noise ratio and burden voltage (the voltage drop across the sensing resistor). The user-defined sensing resistor may be located inside the second probe head or maybe external to the second probe head. In applications in which it is desirable to minimize the burden voltage imposed by the current measurement, an external sensing resistor eliminates the burden voltage resulting from the current being measured flowing back and forth to the probe head. Additionally, an ability for the user to define the value of the sensing resistor allows resistors that already exist in the circuit under test to be used as sensing resistors.

Some versions of the oscilloscope current probe system additionally include a third probe head to sense a current to be measured flowing through an additional user-defined sensing resistor. The user-defined sensing resistor and the additional user-defined sensing resistor differ in value. The third probe head is connectable to the probe amplifier unit interchangeably with the first probe head and the second probe head. The third probe head includes a differential input to receive a measurement voltage generated across the user-defined sensing resistor by the current to be measured, an output at which the measurement voltage is output, and an electrically-readable type identifier that reads differently from the type identifiers of the first probe head and the second probe head.

In yet another embodiment, the oscilloscope current probe system includes a probe amplifier unit, a probe head identifier, first probe head to sense a current to be measured flowing through a predefined sensing resistor, and a second probe head to sense a current to be measured flowing through a user-defined sensing resistor. The probe heads are interchangeably connectable to the probe amplifier unit. Each of the probe heads comprises a respective electrically-readable type identifier. The type identifier of first probe head reads differently from the type identifier of the second probe head. The type identifier of the first probe head represents the value of the predefined sensing resistor. The type identifier of the second probe head indicates that the sensing resistor of the second probe head is user-defined. The first probe head additionally has a differential input to receive a measurement voltage generated across the predefined sensing resistor by the current to be measured, and a measurement voltage output coupled to the differential input. The second probe head additionally has a differential input to receive a measurement voltage generated across the user-defined sensing resistor by the current to be measured, and a measurement voltage output coupled to the differential input. The probe amplifier unit comprises a differential amplifier to amplify the measurement voltage output by the one of the probe heads. The probe head identifier is to read the type identifier of the one of the probe heads connected to the probe amplifier unit.

In the above embodiment, current measurements can be made without additional interaction with the host oscilloscope when the first probe head is used. The host oscilloscope can read the resistance of the predefined sensing resistor included in the type identifier of the first probe head and can automatically configure the current scales against which it displays the current waveform represented by the amplified version of the measurement voltage. The predefined sensing resistor is typically located inside the first probe head, but in some embodiments, the predefined sensing resistor is connected directly to the circuit under test. In this situation, the first probe head is clearly marked with the value of the sensing resistor with which it is to be used.

The customization advantages of using a user-defined sensing resistor with the second probe head are similar to those described above. The type identifier of the second probe head indicates that the sensing resistor of the second probe head is user-defined. In response to reading such a type identifier in the probe amplifier unit, the host oscilloscope activates an input screen that allows the user to input the value of the sensing resistor with which the second probe head is being used. The user-defined sensing resistor may be located inside or external to the second probe head.

In all of the above embodiments, using a sensing resistor to sense the current to be measured instead of a conventional Hall-effect element or transformer eliminates such drawbacks of conventional current sensors as thermal drift, loop area effect, varying impedance, etc. For example, resistors suitable for use as current sensing resistors have a thermal drift of <20 ppm/° C. over a defined temperature range, e.g., a temperature range of −55° C. to +155° C., whereas a conventional Hall effect current sensor has thermal drift in the range of 1-10% over this temperature range. Additionally, the impedance of a resistor is substantially frequency independent, so that the probe loading effect is also substantially frequency independent.

Including an electrically-readable type identifier in each probe head greatly increases the convenience of use of the oscilloscope current probe system described herein. The electrically-readable type identifier provides information that the host oscilloscope can use to display a current scale based on the value of the sensing resistor. The current scale displayed by the oscilloscope enables the user to observe current directly and relieves the user from having to perform mathematical conversions of voltage to current. The current scale displayed by the oscilloscope based on the value of the sensing resistor also helps identify other characteristics, such as minimum and maximum measurable current, of the circuit under test based on the value of the sensing resistor, In some examples of the above-described embodiments, the probe amplifier unit includes the probe head identifier. In other examples, the host oscilloscope includes the probe head identifier.

Figure 1B:
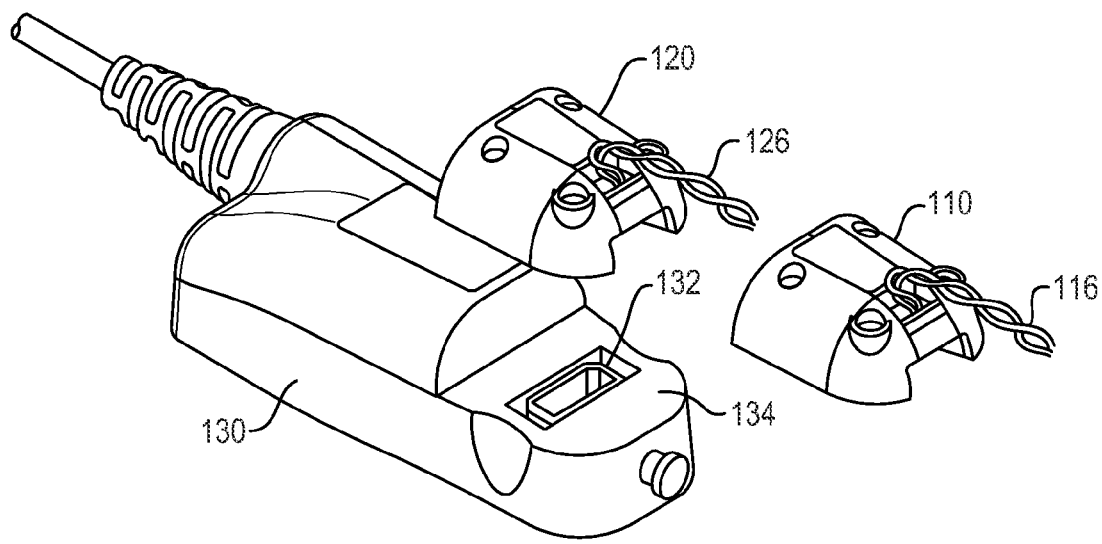
FIG. 1B is a perspective view showing oscilloscope current probe system after first probe head has been disconnected from the probe amplifier unit.

FIG. 1A is a perspective view showing an example 100 of an oscilloscope current probe system in accordance with an embodiment. Oscilloscope current probe system 100 includes a first probe head 110, a second probe head 120, and a probe amplifier unit 130. In other embodiments, oscilloscope current probe system 100 includes more than two probe heads. Probe heads 110, 120 (and any additional probe heads) are interchangeably connected to probe amplifier unit. FIG. 1B is a perspective view showing oscilloscope current probe system 100 after first probe head 110 has been disconnected from probe amplifier unit 130. Second probe head 120 is aligned with probe amplifier unit 130 prior to connecting the second probe head to the probe amplifier unit.

Figure 1C:
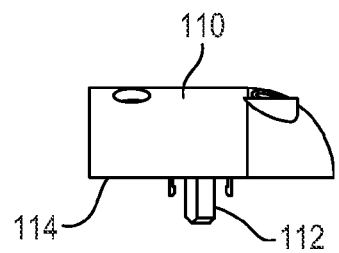
FIGS. 1C and 1D are side views showing first probe head and second probe head.
Figure 1D:
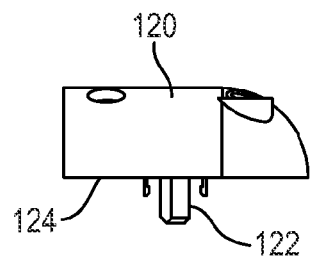

FIGS. 1C and 1D are side views showing first probe head 110 and second probe head 120. Referring additionally to FIG. 1B, first probe head 110 includes a connector 112 configured to mate with a connector 132 located in a surface 134 of probe amplifier unit 130. Second probe head 120 includes a connector 122 identical to that of connector 112 and configured to mate with connector 132. Mating connector 112 or 122 with connector 132 establishes mechanical and electrical connections between the respective probe head 110, 120 and probe amplifier unit 130. Surface 134 of probe amplifier unit 130 abuts a surface 114 of first probe head 110 when connector 112 of first probe head 110 is mated with connector 132, and abuts a surface 124 of second probe head 120 when connector 122 of second probe head 120 is mated with connector 132. In the example shown, connectors 112 and 122 are male connectors, and connector 132 is a female connector. In other examples, the genders of the connectors are the opposite of that show.

A measurement lead 116 having its proximal end connected to first probe head 110 and its distal end connectable to the circuit under test (not shown) provides an electrical connection between a circuit under test and oscilloscope current probe system 100 when first probe head 110 is connected to probe amplifier unit 130. A measurement lead 126 having its proximal end connected to second probe head 120 provides an electrical connection between the circuit under test (not shown) and oscilloscope probe system 100 when second probe head 120 is connected to probe amplifier unit 130.

In some embodiments of oscilloscope current probe system 100, first probe head 110 and second probe head 120 are both what will be referred to as internal sensing resistor probe heads. An internal sensing resistor probe head is a probe head in which the sensing resistor that converts the current being measured into a measurement voltage is located inside the probe head. In other embodiments of oscilloscope current probe system 100, first probe head 110 is an internal sensing resistor probe head and second probe head 120 is what will be referred to as an external sensing resistor probe head. An external sensing resistor probe head is a probe head that receives the voltage generated by the current being measured flowing through a sensing resistor external to the probe head. In yet another embodiment of oscilloscope current probe system 100, first probe head 110 and second probe head 120 are both external sensing resistor probe heads.

Figure 2A:
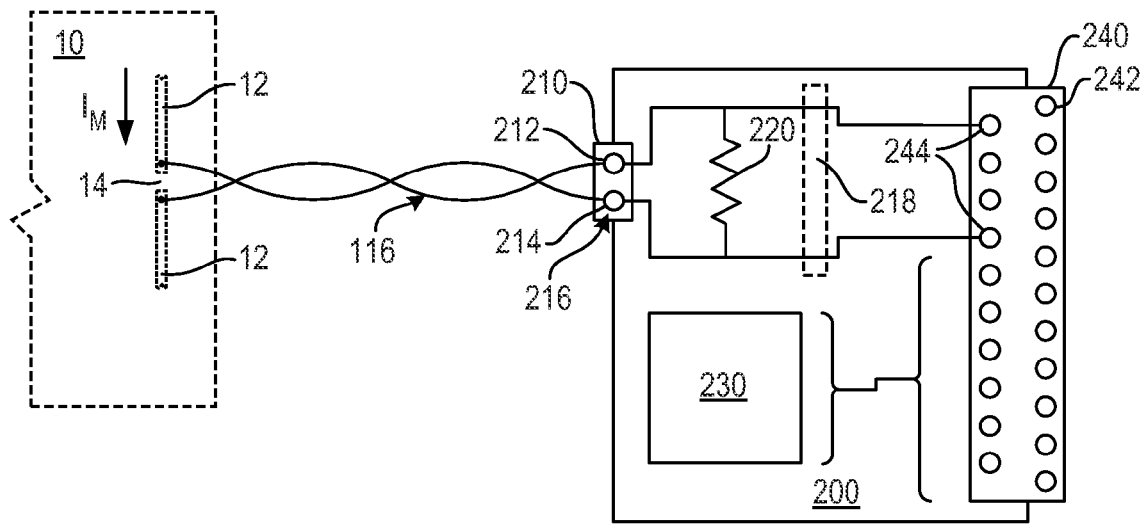
FIGS. 2A, 2B, 3A and 3B are schematic circuit diagrams showing examples of a probe head.
Figure 2B:
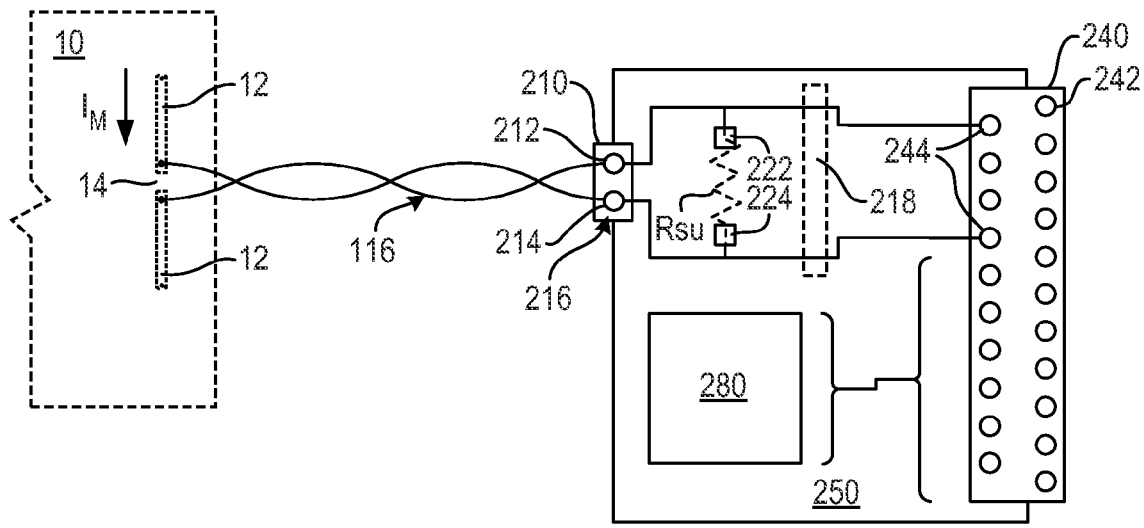
Figure 3A:
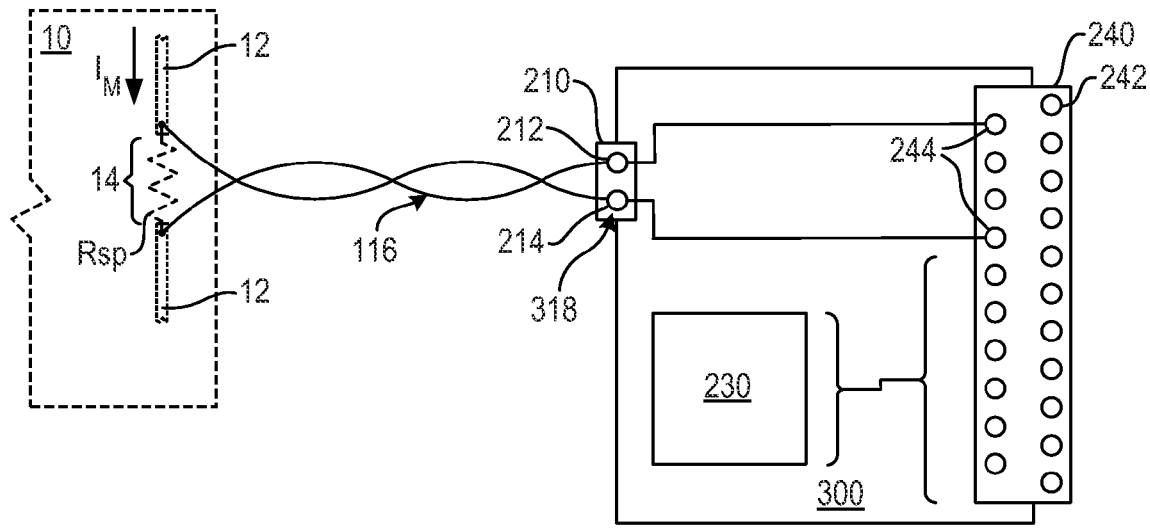
Figure 3B:
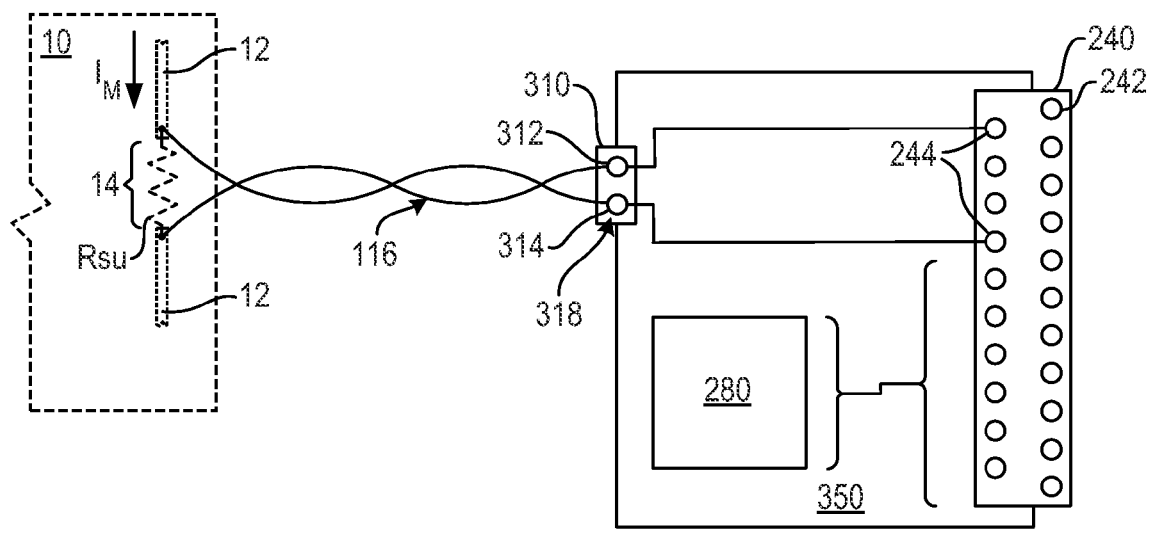

FIGS. 2A, 2B, 3A and 3B are schematic circuit diagrams of examples of first probe head 110. FIGS. 2A and 213 show examples of first probe head 110 configured as an internal sensing resistor probe head. FIGS. 3A and 3B show examples of first probe head 110 configured as an external sensing resistor probe head. FIGS. 2A and 3A show examples in which the sensing resistor is predefined. FIGS. 2B and 3B show examples in which the sensing resistor is user defined. Second probe head 120 configured as an internal sensing resistor probe head would have a circuit diagram similar to FIG. 2A or FIG. 2B. Second probe head 120 configured as an external sensing resistor probe head would have a circuit diagram similar to FIG. 3A or FIG. 313. Elements of the probe head examples shown in FIGS. 2A, 2B, 3A and 3B that are common to two or more of the examples are indicated using the same reference numerals and will not be separately described in connection with each of the examples.

Each of FIGS. 2A, 2B, 3A and 3B shows first probe head 110 measuring a current being measured $I_M$ flowing through a conductor 12 that constitutes part of a circuit under test 10. A break 14 exists or has been formed in conductor 12. The two conductors that collectively constitute measurement lead 116 of probe head 110 are electrically connected, e.g., by soldering, to conductor 12 on opposite sides of break 14.

FIG. 2A shows an example 200 of first probe head 110 configured as an internal sensing resistor probe head having a predefined sensing resistor. Probe head 200 includes an input connector 210, an internal sensing resistor 220, an electrically-readable type identifier 230 and an output connector 240. Input connector 210, sensing resistor 220, type identifier 230, and output connector 240 are typically mounted on a printed circuit board (not shown) that includes traces (not shown) that interconnect the various components in a manner that will be described next.

Input connector 210 is configured to connect to a proximal end of measurement lead 116. In an example, input connector 210 is a quick-release connector that allows the proximal end of measurement lead 116 to be easily and quickly connected to and disconnected from probe head 200. Input connector 210 includes input pins 212, 214 that are electrically connected to respective conductors of measurement lead 116 and to the opposite ends of sensing resistor 220. Input connector 210 provides a current input 216 of probe head 200.

Sensing resistor 220 is connected in series with current input 216 such that the current to be measured received at current input 216 flows through sensing resistor 220. The opposite ends of sensing resistor 220 are connected to a differential input 218 so that the sensing resistor is connected in parallel with the differential input. The differential input receives the measurement voltage generated by the current to be measured flowing through the sensing resistor.

Sensing resistor 220 has a predefined value selected such that the current to be measured produces a voltage across the sensing resistor that is sufficiently high to allow the host oscilloscope with which the oscilloscope current probe system 100 is used to display the current waveform with better than a specified signal-to-noise ratio and that is sufficiently low that it does not produce an unacceptably high burden voltage (i.e., voltage drop the sensing resistor) in circuit under test 10. Because signal-to-noise ratio and voltage drop involve a trade-off, the optimum value of sensing resistor 220 differs between different applications. Accordingly, oscilloscope current probe system 100 typically includes more than one instance of probe head 200. Each instance of probe head 200 has a different predefined value of sensing resistor 220. The different predefined values of sensing resistor 220 allow the user to choose the instance of probe head to 200 having the optimum value of sensing resistor 220 for the current application. In an example, a predefined value of sensing resistor 220 of 20 milliohms is specified to measure currents in the range from 250 μA to 5 A and a predefined value of sensing resistor 220 of 100 milliohms is specified to measure currents in the range from 50 μA to 2.2 A.

Electrically-readable type identifier 230 stores information that identifies at least a model type of probe head 200. Each model type is associated with the specific predefined value of internal sensing resistor 220. In an embodiment of oscilloscope current probe system 100 having N different instances of probe head 200, i.e., probe heads with four different predefined values of internal sensing resistor 220, electrically-readable type identifier 230 stores an electrically-readable parameter that has at least N electrically-distinguishable states. In some embodiments, electrically-readable type identifier 230 additionally or alternatively stores calibration information, such as the individually-measured value of sensing resistor 220.

Output connector 240 is an example of connector 112 described above with reference to FIG. 1C Output connector 240 includes pins that provide electrical connections via which probe head 200 outputs the measurement voltage and type identification to the probe amplifier unit 130 to which the probe head is connected. An exemplary pin of output connector 240 is shown at 242. Reference numeral 242 will also be used to refer to the pins of output connector 240 collectively or to subsets of such pins.

In the example shown, output connector 240 includes a pair of pins 244 that constitute a measurement voltage output of probe head 200. Differential input 218 is connected to pins 244 to output the measurement voltage generated by the current being measured flowing through sensing resistor 220 from probe head 200 to probe amplifier unit 130. In probe amplifier unit 130, a differential amplifier (FIG. 4) amplifies the measurement voltage to provide an analog output voltage for output to the host oscilloscope (not shown). In the example shown, the output voltage of probe amplifier unit 130 is a single ended voltage. In other examples, the output voltage of probe amplifier unit 130 is a differential voltage. The output voltage of probe amplifier unit 130 is at a voltage level compatible with an analog voltage input of the host oscilloscope. In some examples, probe amplifier unit 130 additionally includes an analog-to-digital converter (not shown) that converts the output voltage of the differential amplifier to a digital value for output to a digital input of the host oscilloscope. Probe amplifier unit 130 will be described in greater detail below with reference to FIG. 4.

Output connector 240 additionally includes pins that provide the electrical connections required by probe amplifier unit 130 to read the identification information (and, optionally, other information, such as calibration information) stored in electrically-readable type identifier 230. Probe amplifier unit 130 stores the type identification information received from probe head 200 in a form that is readable by the host oscilloscope. The stored type information represents the value of sensing resistor 220 at least in part. Reading the type information stored in probe amplifier unit 130 enables the host oscilloscope to display the waveform of the output voltage received from the probe amplifier unit against an appropriate current scale. This enables the user to read the current being measured directly off the current scale displayed by the host oscilloscope. Output connector 240 includes pins 242 sufficient in number to provide the above-described electrical connections.

In some embodiments, output connector 240 additionally provides a thermally-conductive path between sensing resistor 220 and probe amplifier unit 130 to enable the probe amplifier unit to dissipate some of the heat generated by the current being measured flowing through the sensing resistor. In such embodiments, output connector 240 typically has a number of pins exceeding the number required to provide the electrical connections.

In operation, the break 14 in conductor 12 causes the current to be measured flowing through conductor 12 to flow through one conductor of measurement lead 116 to current input 216, then through sensing resistor 220, and finally back to conductor 12 through the other conductor of measurement lead 116. The current to be measured passing through sensing resistor 220 generates across the sensing resistor a differential voltage that is proportional to the current. The differential voltage is received by differential input 218 and is output thence to probe amplifier unit 130 through the measurement voltage output provided by pins 244 of output connector 240.

FIG. 2B shows an example 250 of first probe head 110 configured for installation of an internal user-defined sensing resistor. Probe head 250 includes an input connector 210, sensing resistor connections 222, 224, an electrically-readable type identifier 280 and an output connector 240. Input connector 210, sensing resistor connections 222, 224, type identifier 280, and output connector 240 are typically mounted on a printed circuit board (not shown) located inside probe head 250. The printed circuit board Includes traces not shown) that interconnect the various components in a manner that will be described next.

Sensing resistor connections 222, 224 are provided for the user to install a user-defined sensing resistor Rsu in probe head 250 to sense the current to be measured received at current input 216 of probe head 250. Sensing resistor Rsu is user defined in the sense that the value of the sensing resistor is defined by the user. A user-defined sensing resistor allows the user to choose a value that is optimum for the measurement the user wants to perform. Typically, sensing resistor connections 222, 224 are a pair of solder pads to which sensing resistor Rsu is connected by soldering. Other connections that provide a reliable, low-resistance connection to a resistor are known and may be used. Sensing resistor connection 222 is connected to pin 212 of input connector 210 and sensing resistor connection 224 is connected to pin 214 of input connector 210 to connect sensing resistor connections 222, 224 in series with current input 216 so that the current to be measured received at current input 216 flows through sensing resistor Rsu connected to the sensing resistor connections. Sensing resistor connections 222, 224 are also connected to differential input 218, which connects sensing resistor Rsu in parallel with the differential input. The differential input receives the measurement voltage generated by the current to be measured flowing through sensing resistor Rsu. Differential input 218 is connected to pins 244 of output connector 240 to output the measurement voltage generated by the current being measured flowing through sensing resistor Rsu from probe head 250 to probe amplifier unit 130.

Electrically-readable type identifier 280 stores identification information that at least identifies a model type of probe head 250. The model type identifies probe head 250 as being a probe head having a user-defined sensing resistor. The identification information identifying the model types of probe heads having user-defined sensing resistors reads differently from the identification information of model types having predefined sensing resistors. After the probe amplifier unit 130 has read the identification information from the electrically-readable type identifier 280, the probe amplifier unit stores the identification information in a form readable by the host oscilloscope and informs the host oscilloscope that the type identification information has changed. By reading the identification information stored in the probe amplifier unit, the host oscilloscope can determine that a probe head having user-defined sensing resistor is connected to probe amplifier unit 130. After making such determination, the host oscilloscope activates a screen for the user to input the value of the user-defined sensing resistor Rsu. After receiving this user input, the host oscilloscope can display the waveform of the output voltage received from the probe amplifier unit against an appropriate current scale.

In operation, the break 14 in conductor 12 causes the current to be measured flowing through conductor 12 to flow through one conductor of measurement lead 116 to current input 216, then through sensing resistor connection 222, user-defined sensing resistor Rsu, sensing resistor connection 224 and finally back to conductor 12 through the other conductor of measurement lead 116. The current to be measured passing through user-defined sensing resistor Rsu generates across the sensing resistor a differential voltage that is proportional to the current. The differential voltage is received by differential input 218 and is output thence to probe amplifier unit 130 through the measurement voltage output provided by pins 244 of output connector 240.

FIG. 3A shows an example 300 of first probe head 110 configured as an external sensing resistor probe head for use with an external predefined sensing resistor. FIG. 3A shows probe head 300 measuring current being measured $I_M$ flowing through conductor 12 that constitutes part of circuit under test 10. Break 14 exists or has been formed in conductor 12. Predefined external sensing resistor Rsp is electrically connected e.g., by soldering, to conductor 12 across break 14. The current to be measured flowing through conductor 12 generates across external sensing resistor Rsp a measurement voltage proportional to the current to be measured. The distal end of measurement lead 116 is connectable in parallel with predefined external sensing resistor Rsp. In the example shown, the distal ends of the two conductors that collectively constitute measurement lead 116 are electrically connected, e.g., by soldering, to conductor 12 on opposite sides of break 14. Measurement lead 116 conveys the measurement voltage to probe head 300.

External sensing resistor Rsp is predefined in the sense that probe head 300 is identified as being for use with an external sensing resistor of a specific value. In an example, the identification is in the form of a label affixed to probe head 300. In another example, the identification is on the packaging of probe head 300 and/or is in the instruction manual for probe head 300. In some embodiments, sensing resistors of the specific value are supplied as part of instances of oscilloscope current probe system 100 that include with probe head 300. Such sensing resistors are supplied for the user to install or have installed in circuits under test that are tested using oscilloscope current probe system 100 with probe head 300 connected to probe amplifier unit 130. In other embodiments, the user is left to procure sensing resistors of the value specified on probe head 300 or in literature or packaging associated with probe head 300.

Probe head 300 includes input connector 210, electrically-readable type identifier 230 and output connector 240. Input connector 210, type identifier 230, and output connector 240 are typically mounted on a printed circuit board (not shown) that includes traces that interconnect the above-mentioned components in a manner that will be described next.

Input connector 210 constitutes a differential input 318. Input connector 210 is configured to connect to the proximal end of measurement lead 116. In an example, input connector 210 is a quick-release connector that allows measurement lead 116 to be easily and quickly connected to and disconnected from probe head 300. Input connector 210 includes input pins 212, 214 that are electrically connected to the proximal ends of respective conductors of measurement lead 116.

Electrically-readable type identifier 230 stores information that identifies at least a model type of probe head 300. In this example in which external sensing resistor RSP is predefined, electrically-readable type identifier 230 at least stores dictation information that identifies the value of the external current sensing resistor with which probe head 300 is to be used. In an embodiment of oscilloscope current probe system 100 in which N different models of probe head 300 are available, each indicated as being for use with an external sensing resistor Rsp having a respective value different from the values of the sensing resistors of the other models, electrically-readable type identifier 230 stores an electrically-readable parameter that has at least N electrically-distinguishable states. In some embodiments, electrically-readable type identifier 230 additionally or alternatively stores calibration information, such as the individually-measured value of the external sensing resistor Rsp with which probe head 300 is to be used.

Output connector 240 includes a pair of pins 244 that constitute a measurement voltage output of probe head 300. Differential input 318 is connected to pins 244 to output the measurement voltage generated by the current being measured flowing through sensing resistor Rsp from probe head 300 to probe amplifier unit 130. In probe amplifier unit 130, an amplifier (FIG. 5) amplifies the measurement voltage to a level compatible with the host oscilloscope (not shown).

Output connector 240 additionally includes pins that provide the electrical connections required by probe amplifier unit 130 to read the identification information (and, optionally, other information such as calibration information) stored in electrically-readable type identifier 230. In embodiments in which the type identifier information indicates a type of probe head 300 intended for use with a sensing resistor of a specific value, probe amplifier unit 130 stores the type identification information received from probe head 300 in a form that is readable by the host oscilloscope. The stored type information represents the value of sensing resistor Rsp at least in part. Reading the type information stored in probe amplifier unit 130 enables the host oscilloscope to display the waveform of the output voltage received from the probe amplifier unit against an appropriate current scale. This enables the user to read the current being measured directly off the current scale displayed by the host oscilloscope without the need for the user to input the value of the external sensing resistor.

In operation, the break 14 in conductor 12 causes current flowing through conductor 12 to flow through sensing resistor Rsp. The current flowing through sensing resistor Rsp generates a measurement voltage proportional to the current. The measurement voltage is conveyed to the differential input 318 of probe amplifier unit 130 via measurement lead 116, and is output from probe head 300 to probe amplifier unit 130 via pins 244 of output connector 240.

FIG. 3B shows an example 350 of first probe head 110 configured as an external sensing resistor probe head for use with an external user-defined sensing resistor Rsu. Probe head 350 is substantially identical to probe head 300 except that it uses electrically-readable type identifier 280, described above with reference to FIG. 2B, instead of electrically-readable type identifier 230. Electrically-readable type identifier 280 stores identification information that at least identifies a model type of probe head 350. The model type identifies probe head 350 as being a probe head having a user-defined sensing resistor. The identification information identifying the model types of probe heads having user-defined sensing resistors reads differently from the identification information of model types having predefined sensing resistors. After the probe amplifier unit 130 has read the identification information from the electrically-readable type identifier 280, the probe amplifier unit stores the identification information in a form readable by the host oscilloscope and informs the host oscilloscope that the type identification information has changed. By reading the identification information stored in the probe amplifier unit, the host oscilloscope can determine that probe head 350 having a user-defined sensing resistor is connected to probe amplifier unit 130. After making such determination, the host oscilloscope displays a screen for the user to input the value of the user-defined sensing resistor Rsu. After receiving this user input, the host oscilloscope can display the waveform of the output voltage received from the probe amplifier unit against an appropriate current scale.

Figure 4A:
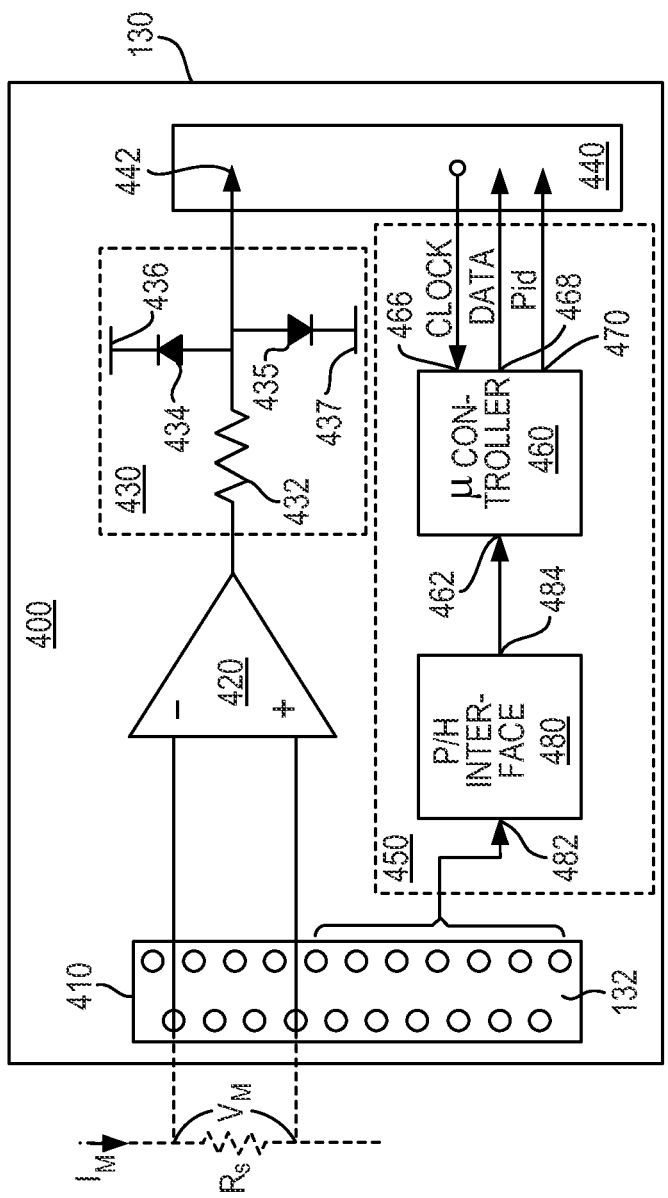
FIG. 4A is a schematic circuit diagram showing an example of a probe amplifier unit that includes a probe head identifier.

FIG. 4A is a schematic circuit diagram of an example 400 of probe amplifier unit 130 that includes a probe head identifier. Probe amplifier unit 130 is shown receiving from a probe head (not shown) connected to the probe amplifier unit a measurement voltage $V_M$ generated by a current being measured $I_M$ flowing through a sensing resistor $R_S$. Sensing resistor $R_S$ may be internal to or external of the probe head, and may be predetermined or user-defined. Probe amplifier unit 130 includes a connector 410, a differential amplifier 420, a scope interface 440, and a probe head identifier 450 In the example shown, probe amplifier unit 130 additionally includes a clamping circuit 430. Other examples lack a clamping circuit.

Connector 410 is an example of connector 132 described above with reference to FIG. 1B and is configured to mate with output connector 112 (FIG. 1C) or output connector 122 (FIG. 1D). Connector 132 includes pins that provide electrical connections via which probe amplifier unit 130 receives the measurement voltage and identification information from the probe head, e.g., first probe head 110 (FIG. 1A), connected to the probe amplifier unit. An exemplary pin of connector is shown at 412. Reference numeral 412 will also be used to refer to the pins of connector 410 collectively.

Differential amplifier 420 has a respective input connected to each of the pins that mate with the pins 244 of output connector 240 (FIG. 2A, for example) that receive the measurement voltage generated by the current to be measured flowing through an internal (e.g., internal sensing resistor 220) or external (e.g., external sensing resistor Rsu) sensing resistor. Differential amplifier 420 applies a defined gain to the voltage difference between its inputs to generate an output voltage. In the example shown, the output voltage generated by amplifier 420 is a single-ended voltage. In other examples, the output voltage generated by amplifier 420 is a differential voltage. Differential amplifier 420 is also specified to operate with a common-mode voltage on its inputs in the range of DC voltage (e.g., ±5V or ±12V) associated with the current to be measured. In an example, an instrumentation amplifier is used as differential amplifier 420. In another example, an operational amplifier is used as differential amplifier 420.

Any kind of amplifier having a differential input and a single-ended or differential voltage or current output may be used as differential amplifier 420.

Clamping circuit 430 is interposed between the output of differential amplifier 420 and a signal output 442 of scope interface 440 at which the amplified measurement voltage generated by the differential amplifier is output. Clamping circuit 430 operates to limit the voltage output to scope interface 440 to a range that will not overload the input of the host oscilloscope. In the example shown, clamping circuit 430 includes a series resistor 432, diodes 434, 435, positive voltage source 436, and negative voltage source 437. Voltage sources 436 and 437 are respectively positive and negative with respect to the quiescent output voltage of amplifier 420. The cathode of diode 434 is connected to positive voltage source 436. The anode of diode 435 is connected to negative voltage source 437. The anode of diode 434, the cathode of diode 435, one end of resistor 432 and the signal output 442 of scope interface 440 are connected to one another. The other end of resistor 432 is connected to the output of amplifier 420. Clamping circuit 430 limits positive excursion of the voltage on signal output 442 to the voltage of positive voltage source 436 plus the forward voltage of diode 434 and limits the negative excursion of the voltage on signal output 442 to the voltage of negative voltage source 437 minus the forward voltage of diode 435.

In some embodiments, probe amplifier unit 130 additionally includes an additional differential amplifier (not shown) and an additional clamping circuit (not shown). The inputs of the additional differential amplifier are connected in parallel with the inputs of differential amplifier 420 to receive the measurement voltage from connector 410. The additional differential amplifier has a gain greater than that of differential amplifier 420. The additional clamping circuit is interposed between the output of the additional differential amplifier and an additional signal output of scope interface 440. The additional differential amplifier produces a higher-gain version of the output signal of differential amplifier 420. The higher-gain output signal is used by the host oscilloscope's "zoom" feature to show portions of the current waveform with higher resolution.

Probe head identifier 450 electrically reads the identification information from the electrically-readable type identifier (e.g., electrically-readable type identifier 230 shown in FIG. 2A) of the probe head. In probe head embodiments in which the sensing resistor is predefined, the identification information read by probe head identifier 450 enables oscilloscope current probe system 100 to be used to measure current without the user having to input the value of the predefined sensing resistor to the host oscilloscope. In probe head embodiments in which the sensing resistor is user defined, the identification information read by probe head identifier 450 instructs the host oscilloscope to activate a screen with which the user can input the value of the user-defined sensing resistor.

Probe head identifier 450 stores the identification information received from probe head 110 in a form that can be read by the host oscilloscope. In the example shown, probe head identifier 450 includes a microcontroller 460 and a probe head interface 480 located between connector 410 and microcontroller 460. Microcontroller 460 has an input 462. Probe head interface 480 has an input 482 to which one or more pins 412 of connector 410 are electrically connected, and an output connected to the input 462 of microcontroller 460. In embodiments in which the identification information read from the electrically-readable type identifier of the probe head is analog information, the input 462 of microcontroller 460 is an analog input, and an analog-to-digital converter (not shown) that constitutes part of microcontroller 460 converts the analog identification information to digital identification information, as will be described in more detail below with reference to FIGS. 5A and 5B. In embodiments in which the identification information is digital information, the input 462 of microcontroller 460 is a digital input to which the output of probe head interface 480 is connected, as will be described in more detail below with reference to FIGS. 5C and 5D. In embodiments in which the identification information is digital, a microcontroller without the above-mentioned analog-to-digital converter may be used as microcontroller 460.

Microcontroller 460 includes a number of registers (not shown) that I used to store data. In particular, the microcontroller includes an identification register and a status register. The microcontroller stores in the identification register the digital identification information read from the probe head, or derived from analog identification and information read from the probe head. The microcontroller stores in the status register codes that represent the current status of probe head identifier 450. Both of these registers can be read by the host oscilloscope.

In the example shown, microcontroller 460 communicates with the host oscilloscope using an I$^2$C interface and includes an I$^2$C clock port 466 and an I$^2$C data input/output port 468 that are used to provide this communication. In other examples, microcontroller 460 uses other communication protocols to communicate with the host oscilloscope and includes clock and data ports appropriate for the communication protocol used. Microcontroller 460 additionally includes a probe identification signal output 470 at which microcontroller 460 outputs a probe identification signal Pid that is readable by the host oscilloscope. Probe identification signal Pid indicates the identity of oscilloscope current probe system 100 to the host oscilloscope. Clock port 466, data input/output port 468 and probe identification signal output 470 are electrically connected to scope interface 440. From an example, microcontroller 460 operates in response to C code stored in firmware in the microcontroller.

In operation, when oscilloscope current probe system 100 is connected to the host oscilloscope, microcontroller 460 outputs probe identification Pid at probe identification signal output 470. When probe head 110, probe head 120 or another probe head is connected to the probe amplifier unit of the oscilloscope current probe system, the probe head outputs the identification information stored in its electrically-readable type identifier to probe amplifier unit 130. Digital identification information passes through probe head interface 480, is received by microcontroller 460 at its input 462 and is stored in the identification register within the microcontroller. Analog identification information is received at the input 462 of microcontroller 460 via probe head interface 480. The internal analog to digital converter of microcontroller 460 converts the analog identification information to digital identification information, and microcontroller 460 stores the digital identification information in the above-described identification register.

Typically, microcontroller 460 processes the raw identification information received directly at its input 462 or obtained by converting analog identification information received at its input 462 to digital information and stores a processed version of the digital identification information in the identification register. In some embodiments, microcontroller 460 additionally converts the processed identification information to a form readable by the host oscilloscope and stores the readable form of the identification information in the identification register.

Examples of the processing performed by microcontroller 460 include debouncing and steady state detection to ensure that the identification information is not finally read until after the probe head is firmly engaged with probe amplifier unit 130. The processing performed by microcontroller 460 can also determine when a probe head has been disconnected from the probe amplifier unit. Each time microcontroller 460 detects that a probe head has been either connected to or disconnected from probe amplifier unit 130, the microcontroller outputs a notification signal to the host oscilloscope and additionally updates its status register to a state that indicates that the probe head has been changed. In an example, microcontroller 460 pulses probe identification signal Pid output at probe identification signal output 470 to provide the notification signal.

The notification signal output by microcontroller 460 indicates to the host oscilloscope that something regarding oscilloscope current probe system 100 has changed. The host oscilloscope then uses the I$^2$C protocol via ports 466 and 468 to read the status register of microcontroller to find out what has changed. The coding the status register indicates that the probe head has changed, the host oscilloscope then reads the identification register in the microcontroller, which contains the identification information read from or derived from the probe head or contains identification information that indicates that no probe head is connected to probe amplifier unit 130. In response to the identification information, the host oscilloscope can determine the type of the probe head connected to the probe amplifier unit 130 (and, specifically, the value of the sensing resistor when the probe head has a predetermined sensing resistor) or that a probe head was disconnected from the probe amplifier unit. With this information, the host oscilloscope can display the appropriate scale against which the current waveform represented by the analog measurement voltage derived from the sensing resistor to be properly displayed.

Figure 4B:
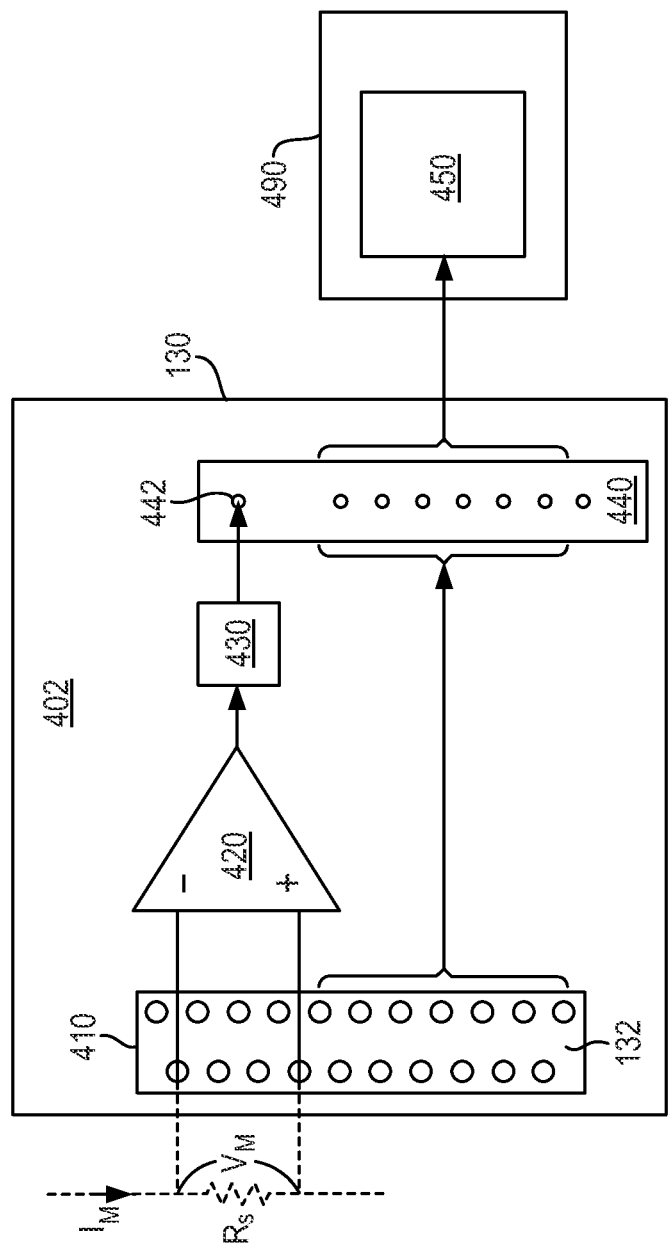
FIG. 4B is a schematic circuit diagram showing an example of a probe amplifier unit in which the probe head identifier is located in the host oscilloscope.

FIG. 4B is a schematic circuit diagram showing an example 402 of probe amplifier unit 130 in which probe head identifier 450 is located in a host oscilloscope 490. Elements shown in FIG. 4B that correspond to elements described above with reference to FIG. 4A are indicated using the same reference numerals and will not be described again here. The electrical connections described above as being between connector 132 and probe head identifier 450 (or its constituent components) pass from connector 132 through probe head amplifier 402 and scope interface 440 to probe head identifier 450 (or its constituent components) located in host oscilloscope 490.

Figure 5A:
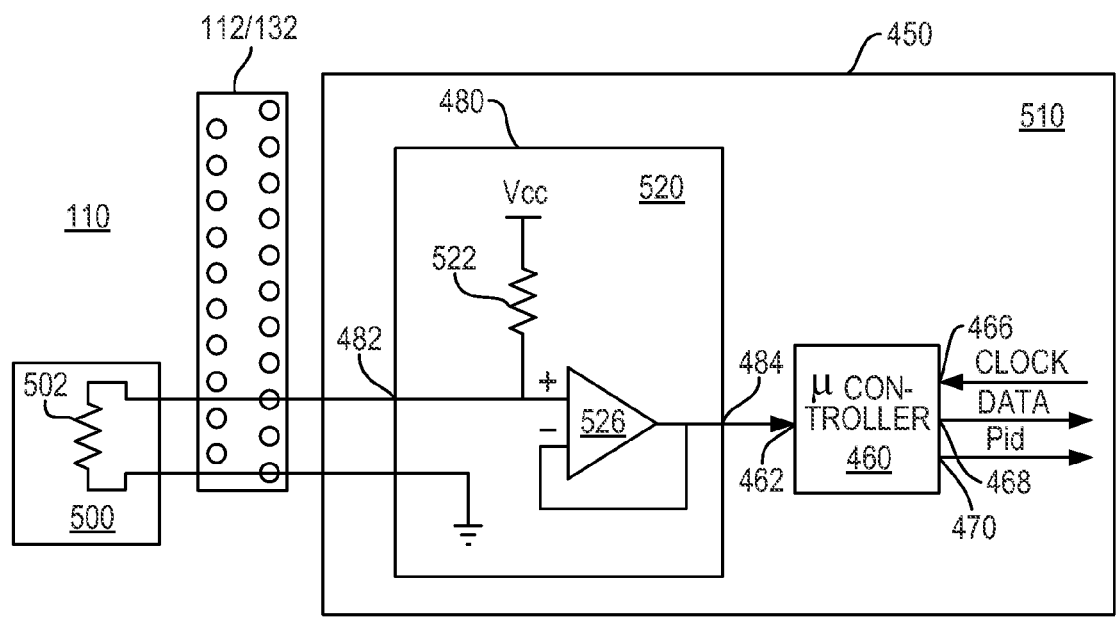
FIGS. 5A-5D are schematic circuit drawings showing examples of the electrically-readable type identifier of the probe head, and corresponding examples of the probe head identifier of probe amplifier unit configured to read the example of the electrically-readable type identifier shown.

FIG. 5A is a schematic circuit drawing showing an example 500 of the electrically-readable type identifier of probe head 110, and an example 510 of the probe head identifier 450 of probe amplifier unit 130 configured to read the example of electrically-readable type identifier 500 shown. Also shown is an example 520 of the probe head interface 480 of probe head identifier 450. Electrically-readable type identifier 500 may be used as electrically-readable type identifier 230 in the examples of probe head 110 shown in FIGS. 2A and 3A, or as electrically-readable type identifier 280 in the examples of probe head 110 shown in FIGS. 2B and 3B, or as the electrically-readable type identifier in probe head 120 described above with reference to FIGS. 1A, 1B and 1D.

In the example shown in FIG. 5A, electrically-readable type identifier 500 includes an identification resistor 502 the value of which provides analog identification information. Conductors electrically connected to the opposite ends of identification resistor 502 are connected to respective pins of connector 112 of probe head 110. The pins of connector 112 mate with corresponding pins of connector 132 of probe amplifier unit 130. One of the corresponding pins of connector 132 is connected to a first supply voltage. In the example shown, the first supply voltage is ground. The other of the corresponding pins of connector 132 is connected to the input 482 of probe head interface 520.

Probe head interface 520 includes a buffer amplifier 526. In the example shown, buffer amplifier 526 is anon-inverting, unity gain amplifier. In other examples, buffer amplifier 526 has a gain different from unity and may be inverting. Buffer amplifier 526 has an output connected to the output 484 of probe head interface 520. Buffer amplifier 526 additionally has an input connected to the input 482 of probe head interface 520 and additionally connected to a second supply voltage via a resistor 522. The second supply voltage differs from the first supply voltage. In the example shown, the second supply voltage is a voltage higher than ground, e.g., Vcc. Resistor 522 and identification resistor 502 form a potential divider between the second supply voltage and the first supply voltage so that the voltage on the input of buffer amplifier 526, depends on the value of identification resistor 502. As a result, the voltage output by probe head interface 520 at its output 484 depends on the value of identification resistor 502. The internal analog-to-digital converter (not shown) of microcontroller 460 converts the voltage received at input 462 from probe head interface 520 to a digital value that the microcontroller stores in its identification register, as described above. Since the value of identification resistor 502 depends on the type of probe head 110 (and on either the value of the predetermined sensing resistor or whether the sensing resistor is user defined), the digital value stored in the identification register represents the type of the probe head connected to probe amplifier unit 130.

When no probe head is connected to probe amplifier unit 130, the voltage on the input of buffer amplifier 526 changes to a level close to the second supply voltage, as does the output voltage of buffer amplifier 526. A digital value representing an output voltage substantially equal to the second supply voltage stored in the identification register indicates to the host oscilloscope that no probe head is connected to probe amplifier unit 130.

Figure 5B:
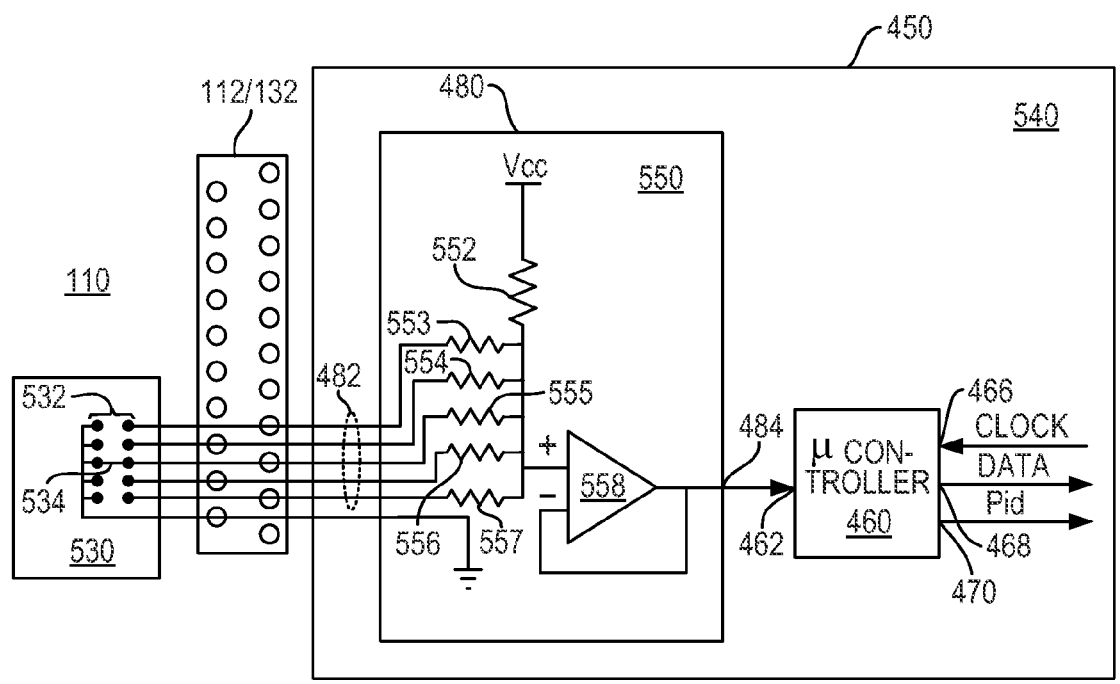

FIG. 5B is a schematic circuit drawing showing another example 530 of the electrically-readable type identifier of probe head 110, and an example 540 of the probe head identifier 450 of probe amplifier unit 130 configured to read the example of electrically-readable type identifier 530 shown. Also shown is an example 550 of the probe head interface 480 of probe head identifier 450. Electrically-readable type identifier 540 may be used as electrically-readable type identifier 230 in the examples of probe head 110 shown in FIGS. 2A and 3A, or as electrically-readable type identifier 280 in the examples of probe head 110 shown in FIGS. 2B and 3B, or as the electrically-readable type identifier in probe head 120 described above with reference to FIGS. 1A, 1B and 1D.

In the example shown in FIG. 5B, electrically-readable type identifier 530 includes an array of contact pairs. An exemplary contact pair is shown at 532. Reference numeral 532 will also be used to refer to the contact pairs collectively. A conductor connects a first contact of each contact pair to at least one pin of connector 112. A respective conductor connects the second contact of each contact pair to a respective pin of connector 112. A link 534 links the contacts of only one of the contact pairs 532. The one of the contact pairs that is linked depends on the type of probe head 110. In an example, a solder bridge forms link 534. In another example, the respective contacts of all of the contact pairs are initially linked, and all but one of the links are severed to define the link 534. In yet another example, a DIP switch in which all the elements are open is connected to the contacts that constitute contact pairs 532 and one of the elements of the DIP switch is closed to provide link 534. More than or fewer than the number of contact pairs shown in this example may be used.

The pins of connector 112 mate with corresponding pins of connector 132 of probe amplifier unit 130. In probe amplifier unit 130, the pin of connector 132 that mates with the pin of connector 112 to which the first contacts of all the contact pairs 532 are connected is connected to a first supply voltage. In the example shown, the first supply voltage is ground. The pins of connector 132 that mate with the pins of connector 112 to which the second contacts of the contact pairs are connected are connected to respective conductors of the input 482 of probe head interface 550.

Probe head interface 550 includes a buffer amplifier 558 similar to the buffer amplifier 526 described above with reference to FIG. 5A. Buffer amplifier 558 has an output connected to the output 484 of probe head interface 550. Buffer amplifier 558 additionally has an input connected to a second supply voltage via a resistor 552. The second supply voltage differs from the first supply voltage. In the example shown, the second supply voltage is a voltage higher than ground, e.g., Vcc. Also connected to the input of buffer amplifier 558 are proximal ends of resistors 553-557. Resistors 553-557 have mutually-different values. The distal ends of resistors 553-557 are connected via input 482 to respective ones of the pins of connector 132 that mate with the pins of connector 112 to which the second contacts of the contact pairs 532 are connected.

Resistor 552 and the one of resistors 553-557 whose distal end is connected by link 534 to the first supply voltage form a potential divider between the second supply voltage and the first supply voltage. Consequently, the voltage on the input of buffer amplifier 558 depends on the value of one of the resistors 553-557 whose distal end is connected to the first supply voltage by link 534. As a result, the voltage output by probe head interface 550 at its output 484 depends on which of the resistors 553-557 is selected by link 534. The internal analog-to-digital converter (not shown) of microcontroller 460 converts the voltage received at input 462 from probe head interface 550 to a digital value that the microcontroller stores in its identification register, as described above. Since the one of the resistors 553-557 selected by link 534 depends on the type of probe head 110 (and on either the value of the predetermined sensing resistor or whether the sensing resistor is user defined), the digital value stored in the identification register represents the type of the probe head connected to probe amplifier unit 130.

When no probe head is connected to probe amplifier unit 130, the voltage on the input of buffer amplifier 558 changes to a level close to the second supply voltage, as does the output voltage of buffer amplifier 558. A digital value representing an output voltage substantially equal to the second supply voltage stored in the identification register indicates to the host oscilloscope that no probe head is connected to probe amplifier unit 130.

Figure 5C:
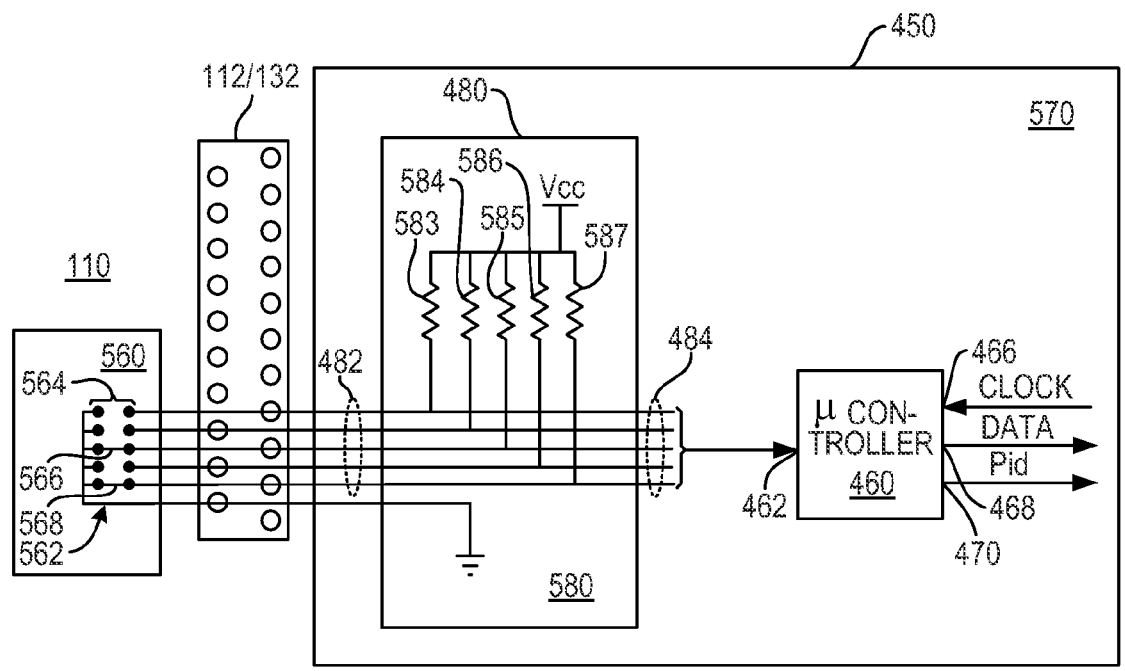

FIG. 5C is a schematic circuit drawing showing an example 560 of the electrically-readable type identifier of probe head 110, and an example 570 of the probe head identifier 450 of probe amplifier unit 130 configured to read the example of electrically-readable type identifier 560 shown. Also shown is an example 580 of the probe head interface 480 of probe head identifier 450. Electrically-readable type identifier 570 may be used as electrically-readable type identifier 230 in the examples of probe head 110 shown in FIGS. 2A and 3A, or as electrically-readable type identifier 280 in the examples of probe head 110 shown in FIGS. 2B and 3B, or as the electrically-readable type identifier in probe head 120 described above with reference to FIGS. 1A, 1B and 1D.

In the example shown in FIG. 5C, electrically-readable type identifier 560 includes a very simple non-volatile memory (ROM) 562. Non-volatile memory 562 is composed of array of contact pairs. An exemplary contact pair is shown at 564. Reference numeral 564 will also be used to refer to the contact pairs collectively. A conductor connects a first contact of each contact pair to at least one pin or connector 112. A respective conductor connects the second contact of each contact pair to a respective pin of connector 112. A respective link finks the contacts of one or more of the contact pairs 564. The contact pairs that are linked by respective links provide digital type identification information representing the type of probe head 110. The contact pairs are binary weighted. The example shown has five contact pairs and can represent ($2^5-1=31$) different types of probe head 110. In the example shown, links 566 and 568 link the third and fifth contact pairs in order of significance so that the contents of non-volatile memory 562 represent probe head type no. 5. Non-volatile memory 562 may be composed of more than or fewer than the number of contact pairs shown in this example.

In an example, a solder bridge forms links 566 and 568. In another example, the respective contacts of all of the contact pairs are initially linked, and one or more of the links are severed to define the contact pairs that are not linked. In yet another example, a DIP switch is connected to the contacts that constitute contact pairs 564 and the DIP switch is set to link the contact pairs to be linked.

The pins of connector 112 mate with corresponding pins of connector 132 of probe amplifier unit 130. In probe amplifier unit 130, the pin of connector 132 that mates with the pin of connector 112 to which the first contacts of contact pairs 562 are connected is connected to a source of a voltage that represents a first logical state. In the example shown, the voltage that represents the first logical state is ground. The pins of connector 132 that mate with the pins of connector 112 to which the second contacts of the contact pairs are connected are connected to respective conductors of the input 482 of probe head interface 580.

Probe head interface 580 includes conductors that connect input 482 to output 484 and a respective pull-up resistor 583-587 is connected between each conductor and a source of a voltage that represents a second logical state. The voltage that represents the second logical state is different from that which represents the first logical state. The output 484 of probe head interface 580 is connected to the input 462 of microcontroller 460. The states of the conductors connected to the input 462 microcontroller 460 represent digital identification information.

When no probe head is connected to probe amplifier unit 130, pull-up resistors 583-587 hold the conductors connected to the input 462 of microcontroller 460 at the voltage that represents the second logical state. When a probe head 110 is connected to probe amplifier unit 130, the links in non-volatile memory 562 hold the corresponding conductors connected to the input 462 of microcontroller 460 at the voltage that represents the first logical state. Thus, each conductor connected to the input 462 of microcontroller 460 is in one of two logical states depending on whether a corresponding link is present in non-volatile memory 562. This coding is used to represent the type of the probe head connected to the probe amplifier unit. The states of the conductors connected to the input 462 collectively constitute digital identification information.

Microcontroller 460 monitors the state of its input 462. When microcontroller 460 detects a change in the state of its input, the microcontroller outputs a notification signal, e.g., by pulsing the probe identification signal output at probe identification signal output 470, updates its status register to indicate that there has been a change in the identity of the probe head, and updates the contents of its identification register with the digital identification information received at its input 462. The host oscilloscope responds to the notification signal received from oscilloscope current probe system 100 by reading the status register and then reading the identification register of microcontroller 460 to determine the type of the newly-connected probe head or to determine that a probe head has been disconnected from the probe amplifier unit.

Figure 5D:
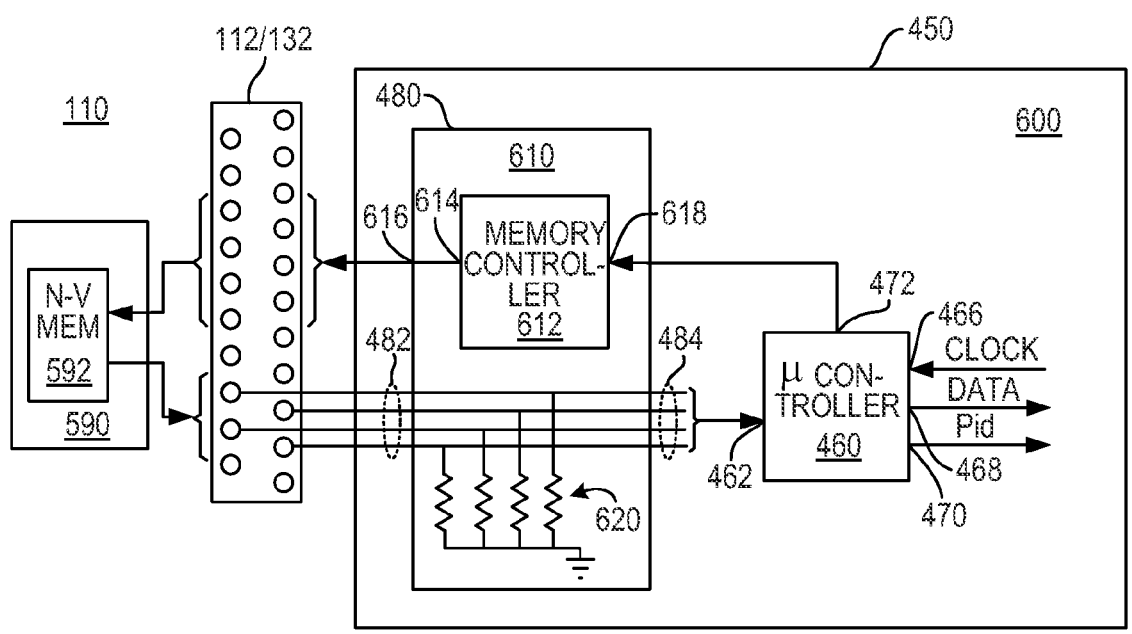

FIG. 5D is a schematic circuit drawing showing an example 590 of the electrically-readable type identifier of probe head 110, and an example 600 of the probe head identifier 450 of probe amplifier unit 130 configured to read the example of type identifier 590 shown. Also shown is an example 610 of the probe head interface 480 of probe head identifier 450. Electrically-readable type identifier 540 may be used as electrically-readable type identifier 230 in the examples of probe head 110 shown in FIGS. 2A and 3A, or as electrically-readable type identifier 280 in the examples of probe head 110 shown in FIGS. 2B and 3B, or as the electrically-readable type identifier in probe head 120 described above with reference to FIGS. 1A, 1B and 1D.

In the example shown in FIG. 5D, electrically-readable type identifier 590 includes a semiconductor non-volatile memory 592, such as a programmable non-volatile memory (PROM), and electronically erasable programmable non-volatile memory (EE PROM), a flash memory, non-volatile resistance RAM or another suitable type of semiconductor-based non-volatile memory. Non-volatile memory 592 has control inputs connected to a first set of pins of connector 112 and data outputs connected to a second set of pins of connector 112. In other examples, non-volatile memory 592 communicates using an I²C protocol or another serial protocol, in which case, communication between electrically-readable type identifier 590 and probe head interface 610 requires only two pins of connector 112.

The pins of connector 112 mate with corresponding pins of connector 132 of probe amplifier unit 130. In probe amplifier unit 130, the pins of connector 132 that mate with the pins of connector 112 to which are connected the data outputs of non-volatile memory 592 are connected to respective conductors of the input 482 of probe head interface 610. Probe head interface 610 includes conductors that connect input 482 to output 484. The output 484 of probe head interface 610 is connected to the input 462 of microcontroller 460. Data output by non-volatile memory 592 represents digital identification information that is input to the input 462 of microcontroller 460.

Probe head interface 610 additionally includes a memory controller 612. Memory controller 612 has a control output 614 connected via a control output 616 of probe head interface 610 to the pins of connector 132 that mate with the pins of connector 112 to which the control inputs of non-volatile memory 592 are connected. Memory controller 612 additionally has a control input 618 connected to a control output 472 of microcontroller 460. In some embodiments, memory controller 612 constitutes part of microcontroller 460. In other embodiments, memory controller 612 is located in probe head 110 either as a separate component or as part of non-volatile memory 592.

When no probe head is connected to probe amplifier unit 130, a resistor array 620 holds the input 462 of microcontroller 460 in a predetermined state. In the example shown resistor array 620 holds input 462 in an all-zero state. Microcontroller 406 stores the state of input 462 in its identification register. This state indicates to the host oscilloscope that no probe head is connected to probe amplifier unit 130.

When probe head 110 is connected to probe amplifier unit 130, memory controller 612 sends an instruction to non-volatile memory 592 to output the digital identification information stored therein at a predetermined address. Non-volatile memory 592 outputs the digital identification information to the conductors connected to the input 462 of microcontroller 460.

Microcontroller 460 monitors the state of its input 462. When microcontroller 460 detects a change in the state of its input, the microcontroller outputs a notification signal, e.g., by pulsing the probe identification signal output at probe identification signal output 470, updates its status register to indicate that there has been a change in the identity of the probe head, and updates the contents of its identification register with the digital identification information received at its input 462. The host oscilloscope responds to the pulsing of the probe identifier line by reading the status register and then reading the identification register to determine the type of the newly-connected probe head or to determine that a probe head has been disconnected from the probe amplifier unit.

In another example, probe head interface 480 simply provides connections between connector 132 and the input 462 of microcontroller 460. In this example, memory controller 612 is incorporated within microcontroller 460. Additionally, resistor array 620 can be omitted when the communication protocol between input 462 and non-volatile memory 592 can detect when the probe head is disconnected. In an example in which the communication protocol is the I²C communication protocol, a "slave_not_acknowledge" code returned by the communication protocol would indicate to microcontroller 460 that the probe head is disconnected.

In some embodiments, non-volatile memory 592 has stored therein digital information in addition to the digital identification information. In such embodiments, memory controller 612 issues additional instructions that cause non-volatile memory 592 to output the additional digital information to probe amplifier unit 130. In the probe amplifier unit, microcontroller 460 stores the additional digital information in additional registers (not shown) that are readable by the host oscilloscope. In an example, the additional digital information as precision calibration information relating to the sensing resistor in or connected to the probe head connected to the probe amplifier unit. The host oscilloscope can configure itself in response to the precision calibration information read from non-volatile 592. In another example, the additional digital information uniquely identifies the probe head connected to the probe amplifier unit. Uniquely identifying the probe head enables the host oscilloscope to distinguish among different probe heads of the same type. In an example, the additional digital information enables the host oscilloscope to distinguish among different probe heads of the same type for which individual calibration information has been provided to the host oscilloscope.

This disclosure describes the invention in detail using illustrative embodiments. However, the invention defined by the appended claims is not limited to the precise embodiments described.

We claim:

1. An oscilloscope current probe system, comprising a first probe head, a second probe head, a probe amplifier unit and a probe head identifier, in which:
   the first probe head and the second probe head are interchangeably connectable to the probe amplifier unit;
   each of the first probe head and the second probe head comprises a respective electrically-readable type identifier, a respective current input to receive a current to be measured, a respective internal sensing resistor in connected series with the current input, and a respective output at which a measurement voltage across the sensing resistor is output;
   the first probe head has a sensing resistor resistance different from, and a type identifier that reads differently from, the sensing resistor resistance and the type identifier, respectively, of the second probe head;
   the probe amplifier unit comprises a differential amplifier to amplify the measurement voltage output by the one of the probe heads; and
   the probe head identifier is to read the type identifier of the one of the probe heads connected to the probe amplifier unit.

2. The oscilloscope current probe system of claim 1, in which the probe amplifier unit additionally comprises the probe head identifier.

3. The oscilloscope current probe system of claim 1, additionally comprising a host oscilloscope comprising the probe head identifier.

4. The oscilloscope current probe system of claim 1, additionally comprising a third probe head to sense a current to be measured flowing through an external sensing resistor, external to the third probe head, in which:
   the third probe head is connectable to the probe amplifier unit interchangeably with the first probe head and the second probe head;
   the third probe head comprises an electrically-readable type identifier, a differential input to receive a measurement voltage generated across the external sensing resistor head by the current to be measured, and an output at which the measurement voltage is output; and
   the type identifier of the third probe head reads differently from the type identifiers of the first probe head and the second probe head.

5. The oscilloscope current probe system of claim 1, in which:
   the first probe head is a probe head of a first type, and the system additionally comprises an additional probe head of the first type, and
   the probe heads of the first type have nominally identically reading electrically-readable type identifiers and nominally identical current sensing resistor resistances.

6. The oscilloscope current probe system of claim 1, in which:
   the first probe head is a first type of probe head and the system additionally comprises an additional probe head of the first type, and
   the probe heads of the first type have electrically-readable type identifiers that read more similarly and current sensing resistor resistances that are more similar to one another than to the electrically-readable type identifier and current sensor resistor resistance of the second probe head.

7. The oscilloscope current probe system of claim 1, in which the type identifier comprises a resistor.

8. The oscilloscope current probe system of claim 1, in which:
   the system additionally comprises a connector mounted on the probe amplifier unit and a mating connector mounted on each probe head, the mating connector comprising pins; and
   the type identifier comprises selectively interconnected pins on the mating connector.

9. The oscilloscope current probe system of claim 1, in which the type identifier comprises a non-volatile memory.

10. An oscilloscope current probe system, comprising a first probe head to sense a current to be measured flowing through user-defined sensing resistor, a second probe head, a probe amplifier unit, and a probe head identifier, in which:
   the probe heads are interchangeably connectable to the probe amplifier unit;
   each of the first probe head and the second probe head comprises a respective electrically-readable type identifier;
   the type identifier of first probe head reads differently from the type identifier of the second probe head;
   the first probe head additionally comprises a differential input to receive a measurement voltage generated across the user-defined sensing resistor by the current to be measured, and an output at which the measurement voltage is output;
   the second probe head additionally comprises a current input to receive a current to be measured, an internal sensing resistor in connected series with the current input, and an output at which a measurement voltage across the internal sensing resistor is output;
   the probe amplifier unit comprises a differential amplifier to amplify the measurement voltage output by the one of the probe heads; and
   the probe head identifier is to read the type identifier of the one of the probe heads connected to the probe amplifier unit.

11. The oscilloscope current probe system of claim 10, in which the probe amplifier unit additionally comprises the probe head identifier.

12. The oscilloscope current probe system of claim 10, additionally comprising a host oscilloscope comprising the probe head identifier.

13. The oscilloscope current probe system of claim 10, additionally comprising a third probe head to sense a current to be measured flowing through an additional user-defined sensing resistor, in which:
   the user-defined sensing resistor and the additional user-defined sensing resistor differ in value;
   the third probe head is connectable to the probe amplifier unit interchangeably with the first probe head and the second probe head;
   the third probe head comprises an electrically-readable type identifier, a differential input to receive a measurement voltage generated across the user-defined sensing resistor by the current, and an output at which the measurement voltage is output; and
   the type identifier of the third probe head reads differently from the type identifiers of the first probe head and the second probe head.

14. The oscilloscope current probe system of claim 10, in which:
   the second probe head is a first type of probe head and the system additionally comprises an additional probe head of the first type, and
   the probe heads of the first type have nominally identically-reading electrically-readable type identifiers and nominally identical current sensing resistor resistances.

15. The oscilloscope current probe system of claim 10, in which:
   the second probe head is a probe head of a first type, and the system additionally comprises an additional probe head of the first type, and
   the probe heads of the first type have electrically-readable type identifiers that read more similarly and current sensing resistor resistances that are more similar to one another than to the electrically-readable type identifier and current sensor resistor resistance of the second probe head.

16. The oscilloscope current probe system of claim 10, in which the type identifier comprises a resistor.

17. The oscilloscope current probe system of claim 10, in which:
   the system additionally comprises a connector mounted on the probe amplifier unit and a mating connector mounted on each probe head, the mating connector comprising pins; and
   the type identifier comprises selectively interconnected pins on the mating connector.

18. The oscilloscope current probe system of claim 10, in which the type identifier comprises a non-volatile memory.

19. The oscilloscope current probe system of claim 10, in which the user-defined sensing resistor is external to the first probe head.

20. An oscilloscope current probe system, comprising a probe amplifier unit, a probe head identifier, a first probe head to sense a current to be measured flowing through a predefined sensing resistor, and a second probe head to sense a current to be measured flowing through a user-defined sensing resistor, in which:
   the probe heads are interchangeably connectable to the probe amplifier unit;
   each of the probe heads comprises a respective electrically-readable type identifier;
   the type identifier of first probe head reads differently from the type identifier of the second probe head;
   the type identifier of the first probe head represents the value of the predefined sensing resistor;
   the type identifier of the second probe head indicates that the sensing resistor of the second probe head is user-defined;
   the first probe head additionally comprises a differential input to receive a measurement voltage generated across the predefined sensing resistor by the current to be measured, and a measurement voltage output coupled to the differential input;
   the second probe head additionally comprises a differential input to receive a measurement voltage generated across the user-defined sensing resistor by the current to be measured, and a measurement voltage output coupled to the differential input;
   the probe amplifier unit comprises a differential amplifier to amplify the measurement voltage output by the one of the probe heads; and
   the probe head identifier is to read the type identifier of the one of the probe heads connected to the probe amplifier unit.

21. The oscilloscope current probe system of claim 20, in which the probe amplifier unit additionally comprises the probe head identifier.

22. The oscilloscope current probe system of claim 20, additionally comprising a host oscilloscope comprising the probe head identifier.

23. The oscilloscope current probe system of claim 20, in which:
   the first probe head additionally comprises a current input to receive the current to be measured; and
   the predefined sensing resistor is located inside the first probe head and is connected in series with the current input and in parallel with the differential input.

24. The oscilloscope current probe system of claim 20, in which the predefined sensing resistor is external to the first probe head.

25. The oscilloscope current probe system of claim 24, additionally comprising a measurement lead having a proximal end connectable to the differential input of the first probe head and a distal end connectable in parallel with the sensing resistor.

26. The oscilloscope current probe system of claim 20, in which the second probe head additionally comprises:
   a current input to receive the current to be measured; and
   sensor resistor connections inside the second probe head for connection of the user-defined sensing resistor, in which the connections are connected in series with the current input and in parallel with the differential input.

27. The oscilloscope current probe system of claim 20, in which the user-defined sensing resistor is external to the second probe head.

28. The oscilloscope current probe system of claim 27, additionally comprising a measurement lead having a proximal end connectable to the differential input of the second probe head and a distal end connectable in parallel with the user-defined sensing resistor.

29. The oscilloscope current probe system of claim 20, in which the type identifier comprises a resistor.

30. The oscilloscope current probe system of claim 20, in which:
   the system additionally comprises a connector mounted on the probe amplifier unit and a mating connector mounted on each probe head, the mating connector comprising pins; and
   the type identifier comprises selectively interconnected pins on the mating connector.

31. The oscilloscope current probe system of claim 20, in which the type identifier comprises a non-volatile memory.

* * * * *